United States Patent [19]

Namiki

[11] Patent Number: 5,641,559
[45] Date of Patent: Jun. 24, 1997

[54] GAS-TIGHT LAMINATED PLASTIC FILM CONTAINING POLYMER OF ORGANOSILICIC COMPOUND

[75] Inventor: Tsunehisa Namiki, Ayase, Japan

[73] Assignee: Toyo Seikan Kaisha, Ltd., Tokyo, Japan

[21] Appl. No.: 500,679

[22] Filed: Jul. 11, 1995

Related U.S. Application Data

[63] Continuation-in-part of Ser. No. 965,921, Oct. 23, 1992, abandoned.

[51] Int. Cl.$^6$ .............................. B32B 7/02; B32B 27/32; B32B 27/36
[52] U.S. Cl. ....................... 408/216; 428/215; 428/336; 428/446; 428/448; 428/451; 428/480
[58] Field of Search .................. 428/35.4, 35.7, 428/213, 215, 216, 336, 446, 447, 448, 451, 452, 480

[56] References Cited

U.S. PATENT DOCUMENTS

| | | | |
|---|---|---|---|
| 3,442,686 | 5/1969 | Jones | 428/336 |
| 4,702,963 | 10/1987 | Phillips et al. | 428/426 |
| 5,085,904 | 2/1992 | Deak et al. | 428/35.7 |

*Primary Examiner*—D. S. Nakarani
*Attorney, Agent, or Firm*—Beveridge, DeGrandi, Weilacher & Young, L.L.P.

[57] ABSTRACT

A first layer made of a polymer of organosilicic compound containing at least silicon, oxygen and carbon is formed over a plastic substrate, and a second layer made of silicon oxide is then formed over the first layer, and the first and second layers in combination exhibit excellent gas-tight characteristics.

4 Claims, 3 Drawing Sheets

GAS-TIGHT LAMINATED PLASTIC FILM CONTAINING POLYMER OF ORGANOSILICIC COMPOUND

This application is a continuation-in-part of application Ser. No. 07/965,921, filed Oct. 23, 1992, now abandoned, which application is entirely incorporated herein by reference.

BACKGROUND OF THE INVENTION

The present invention relates to a plastic material which is used for packing or the like, and which blocks the permeation of gas therethrough, and also relates to a method of manufacturing the plastic material.

DESCRIPTION OF THE RELATED ART

Heretofore, various attempts have been made to obtain plastic packing materials which prevent permeation of gas therethrough so as to protect and preserve the contents that are to be packed therewith. Typical examples thereof are as follows:

(1) a method in which a plastic material is covered with an inorganic thin film made of $SiO_x$, aluminum oxide or the like;

(2) a method in which a layer of barrier resin such as polyvinylidene chloride or the like is provided so as to form a laminated material;

(3) a method in which a metallic film such as aluminum foil or the like is laminated.

Further, Japanese Laid-Open Patent No. 3-183759 discloses a laminated film in which a plastic film is coated with a synthetic resin material that is the same as the material of the plastic film, by vacuum evaporation or sputtering so as to form a film-like organic material layer, then an inorganic material is vapor-deposited thereover so as to form a layer of a mixture of the deposited organic material and the vapor deposited inorganic material, and thereafter, an inorganic material layer is formed over the layer of the mixture.

The plastic material is completely different from the inorganic material used as the coating layer so as to have less affinity for the latter. Accordingly, the plastic material is coated with a synthetic resin material the same as that of the plastic material so as to form, as an intermediate layer, a blended layer composed of the synthetic resin material and the inorganic material in order to improve the fixation of the inorganic material. However, the fixation of the inorganic material cannot be enhanced to a satisfactory extent since not only the inorganic material but also the synthetic resin material exists at the outer surface of the blended layer. Further, the evaporation of a synthetic resin material and an inorganic material in two steps cannot be used to form molded materials although it can be used for sheet-like materials.

In addition, the evaporation of the synthetic resin material causes a lowering of the molecular weight of the plastic material so as to deteriorate the processability thereof.

The plastic packing materials which are presently available are not satisfactory due to the above-mentioned problems. That is, methods of blocking permeation of gas which have been attempted heretofore have been both advantageous and disadvantageous, and accordingly, they have been not sufficiently satisfactory.

More particularly, in the method stated in item (1) above, the plastic material gives a high degree of recycling ability so as to raise no problem of disposal, but its gas-tightness is insufficient;

In the method stated in item (2) above, although polyvinylidene chloride gives a sufficient gas-tightness, a severe problem in disposal arises because it produces chlorine.

In the method stated in item (3) above, the lamination of a metal film such as aluminum foil or the like does not raise a disposal problem and provides a satisfactory gas-tightness. However, it is not transparent and blocks microwaves, and accordingly, the contents thereof cannot be seen and heated in a microwave oven.

SUMMARY OF THE INVENTION

Accordingly, an object of the present invention is to solve the above-mentioned problems by providing a method of manufacturing a gas-tight plastic material which can prevent permeation of gas therethrough and is in the form of an extremely thin layer.

These and other objects are achieved according to a feature of the present invention which resides in a gas-tight laminated plastic composite formed of a plastic material, a first layer laid over the plastic material, and made of a polymer of organosilicic compound containing silicon, oxygen and carbon, and a second layer laid over the first layer and made of silicon oxide.

In the above-mentioned gas-tight laminated plastic composite, the polymer of organosilicic compound which forms the first layer is composed of more than 15% of silicon, more than 20% of carbon and the balance of oxygen.

In particular, the silicon oxide compound as a main component in the second layer is composed of $SiO_x$ ($x=1.5$ to $2.0$).

The content of the silicon oxide compound in the second layer is more than 60% and is composed of $SiO_x$ ($x=1.5$ to $2.0$).

Further, the first layer has a thickness of 0.01 to 0.1 μm, and the second layer has a thickness of 0.03 to 0.2 μm.

According to the second aspect of the present invention, there is provided a method of manufacturing a gas-tight laminated plastic composite, comprising the steps of turning a monomer of organosilicic compound into plasma with the use of a low temperature plasma process, treating a plastic substrate with the plasma so as to form an organosilicic compound coating over the outer surface of the plastic substrate, and covering the organosilicic compound coating deposited on the plastic substrate with a top coat of silicon oxide compound film.

In the above-mentioned method according to the present invention, the monomer of organosilicic compound is one or more selected from the group consisting of vinyl alkoxisilane, tetra-alkoxisilane, alkyl tri-alkoxisilane, phenyl tri-alkoxisilane, polymethyl disiloxane, polymethyl cyclotetrasiloxane-siloxane.

The top coat of silicon oxide film is formed by causing a gaseous-form organosilicic compound to act upon oxygen gas on the plastic substrate.

Alternatively, the silicon oxide film is formed by coating the organosilicic compound film thereover with silicon oxide by a PVD process or a CVD process.

Further, the silicon oxide film can be formed of a coating of a mixture of silicon monoxide and silicon dioxide by vacuum evaporation.

still further, the silicon oxide film can be made of a mixture of silicon oxide and other metal compound.

Specifically, the silicon oxide film contains more than 60% of the silicon oxide which is composed of $SiO_x$ ($x=1.5$ to $2.0$).

From a study made by the applicants, it was found that a silicon oxide film ($SiO_x$ film) with which a plastic material is coated, did not have sufficient gas-tightness.

Since the silicon oxide film exhibited satisfactory characteristics although it had a low degree of gas-tightness, further studies were made in order to enhance the gas-tightness.

The following are typical examples of methods of coating a plastic material with silicon oxide compound ($SiO_x$):

a. A vacuum evaporation method, an ion-plating method, a sputtering method or the like, using SiO or $SiO_2$ as an ingredient;

b. A plasma CVD method using monosilane ($SiH_4$) and gas containing oxygen as ingredients; and c. A plasma CVD method using an organosilicic compound such as tetra-ethoxysilane or the like, and gas containing oxygen as ingredients.

However, it was found that a silicon oxide film formed on a plastic material with the use of the above-mentioned methods exhibits insufficient gas-tightness.

A first feature of the present invention is the provision of a polymer coating first layer made of organosilicic compound containing silicon, carbon and oxygen, over a plastic material although this layer itself does not have gas-tightness.

A second feature of the present invention is the provision of a silicon oxide layer onto the above-mentioned first layer. As mentioned above, this silicon oxide layer formed directly over the plastic material does not give an effect of blocking the permeation of gas.

However, the gas-tightness can be remarkably enhanced by synergistic effects of both the first and second layer if the second layer which is the silicon oxide layer is formed over the first layer which is the polymer of the organosilicic nature.

The reason why the remarkable effect can be obtained by these two layers which are laminated one upon another in that order is not scientifically clear, but the above-mentioned technical effect exhibited by the present invention is repeatable and reproducible.

It is believed that the effect of gas-tightness given by the silicon oxide layer is greatly contributed by the stable fixation of microparticles of silicon oxide fed onto the coated substrate. That is, the fed particles move on the plastic substrate and become fixed at most stable positions. In this case, the silicon oxide particles can stabilize and become fixed if a coating film made of a polymer of an organo-silicon compound containing silicon, carbon and oxygen is formed on the plastic substrate. Further, it is considered that the distribution of the particles are uniform, and further, particles of oxides are superposed over the stabilized silicon compound particles so as to form the silicon oxide coating which is very dense.

The third feature of the present invention is the formation of a coating film made of a polymer of organosilicic compound over a plastic material with the use of a low temperature plasma CVD method using the organosilicic compound as an ingredient.

The polymer coating film contains at least silicon, carbon and oxygen with the composition ratio, that is, more than 15% of silicon and more than 20% of carbon. Further, the thickness of polymer coating film is 0.01 to 0.1 µm, and preferably 0.02 to 0.07 µm. A high temperature plasma CVD method is not preferable since the plastic substrate is thermally affected.

As the low temperature method, any one of a high frequency plasma method, an a.c. plasma process, a d.c. plasma process and a microwave plasma process can be used.

A fourth feature of the present invention is the formation of a silicon oxide film ($SiO_x$ film) over the above-mentioned organosilicic compound coating film with the use of the above-mentioned PVD or CVD method.

The thickness of the silicon oxide film is 0.03 to 0.2 µm, preferably, 0.05 to 1.4 µm.

The organosilicic compound polymer layer does not exhibit gas-tightness. However, the gas-tightness can be remarkably enhanced if the silicon oxide coating film is formed over the polymer layer. The silicon oxide layer is made of a silicon oxide compound, but can contain therein other metal compounds such as MgO, $MgF_2$/, $CuC_3$ or the like. However, since this second layer contains the silicon oxide compound as a main component, more than 60%, preferably more than 65%, of the silicon oxide compound must exist in the second layer.

The inorganic silica particles which have been deposited onto the organosilicic compound coating layer on the surface of the plastic material by the PVD or CVD method moves on the substrate and stabilizes at most stable positions and affixes to the substrate. Further, the inorganic particles are deposited over the organosilicon layer so as to form a coating film.

The applicants consider that the silicon oxide particles which have been fed by the PVD or CVD method onto the coating film made of the polymer of organosilicic compound and formed over the surface of the underlying plastic material can be satisfactrily stabilized, and accordingly, a uniform and stable silicon oxide coating film can be formed.

In view of this consideration, the applicants studied coating films made of the polymer of organosilicic compound, which were formed on the surfaces of the plastic materials by various kinds of methods, and found that coating films which were formed by the conventional method could not offer substantial effects. However, it was found that thin membrane-like coating films which were formed by polymerizing a monomer of organosilicic compound with the use of a low temperature plasma method could offer remarkable effects.

The silicon oxide coating film thus laid over the film made of the polymer of organosilicic compound may be formed in a thin film-like shape from silicon oxide such as $SiO_2$ or the like by a PVD method such as vacuum evaporation or the like, or may be formed by introducing oxygen gas so as to form an oxide film with a plasma CVD method similar to that used in the process of forming the coating film made of the polymer of organosilicic compound.

The first layer made of the polymer of organosilicic compound contains therein more than 15% of silicon, more than 20% of carbon and the balance of oxygen, having a thin thickness of 0.01 to 0.1 µm is preferred.

Should the thickness of the film exceeds the above-mentioned range, the gas-tightness can be lowered and is less preferred.

The special coating film of organosilicic compound polymer as the first layer, can be formed in accordance with the invention by polymerizing an organosilicic compound monomer such as hexamethyl disilane or the like on the plastic substrate.

Vinyl triethoxysilane, vinyl trimethoxysilane, tetramethoxysilane, tetraethoxysilane, phenyl trimethoxysilane, octamethyl cyclotetra siloxane, methyl trimethoxysilane, methyl triethoxysilane, 1,1,3,3-tetramethyl disiloxane, hexa methyl disiloxane, or the like are used as the organosilicic compound monomer used in the present invention. Any suitable organosilane or organosiloxane which are widely known in the art as polymerizable monomers can be used or mixtures thereof.

The second layer which is made of the silicon oxide, can contain a metal compound MgO, MgF$_2$, CuCO$_3$ or the like. However, the second layer should contain more than 60%, preferably more than 65% of silicon oxide as a main component.

The silicon oxide coating film as the second layer can be formed by a PVD method with the use of silicon oxide such as silicon dioxide or the like and other metal compounds.

The third feature of the present invention as described herein is such that the plastic material with a gas-tight layer is completely free of any problem of disposal, and can be recycled.

Polyester resins such as polyethylene terephthalate or the like, polyolefin resins such as polyethylene, polypropylene or the like, nylon, polyvinyl alcohol, polyvinyl chloride resin, polycarbonate resin or the like can be used as the plastic layer on which the gas-tight layer is formed according to the present invention. These synthetic polymeric resin materials are well known in the art for film formations useful in the packaging industry.

The plastic material on which the gas-tight layer is formed has a low moldability, and accordingly, it is preferable to form such a gas-tight layer, by coating, over a package container such as a bottle, a bag, a box or the like which has been molded. A plastic film on which the gas-tight layer has been formed, can be fabricated into a bag by laminating a protecting layer over the gas-tight layer.

The gas-tight plastic according to the present invention, can withstand sterilization by boiling water since the gas-tight layer has a satisfactory fixation, and accordingly, it can be used suitably for retort packed food.

Other features and advantages will become apparent from the following description of the preferred embodiments which will be explained in detail with reference to the drawings.

DESCRIPTION OF THE PREFERRED EMBODIMENTS

The preferred embodiments of the present invention will be specified hereinbelow, including manufactured examples.

In the case of sheets which were used as substrates in the following reference examples and comparison examples, the vapor permeation volume was measured with the use of Automatic Permeability Tester L80-400 manufactured by LYSSY Co. under a measuring condition in which the temperature was 40° C. and the relative humidity was 90%. The unit of permeation was given by g/cm$^2$.day. The permeation volume of oxygen gas was measured by OX-Tran 100 manufactured by Modern Control Co. under a measuring condition in which the temperature was 27° C., and the relative humidity was 90% while the unit of permeation was exhibited by CC/m$^2$ day atm.

In the case of bottles, cups or the like which are used as substrates, 2 g of water was charged in a bottle or cup. A laminated body in which aluminum foil, and polypropylene polyethylene or terephathalate resin were laminated was used as a cover member. The bottle or cup in which water was charged was heat-sealed with the use of the laminated body with the aluminum foil being exposed to the outside. It was held in atmospheres of 40% RH at 50° C., and 10% RH at 40° C., and the variation in the weight thereof was measured so as to determine the volume of vapor permeation.

The explanation hereinbelow relates to the devices used in the present invention.

Figure 1:
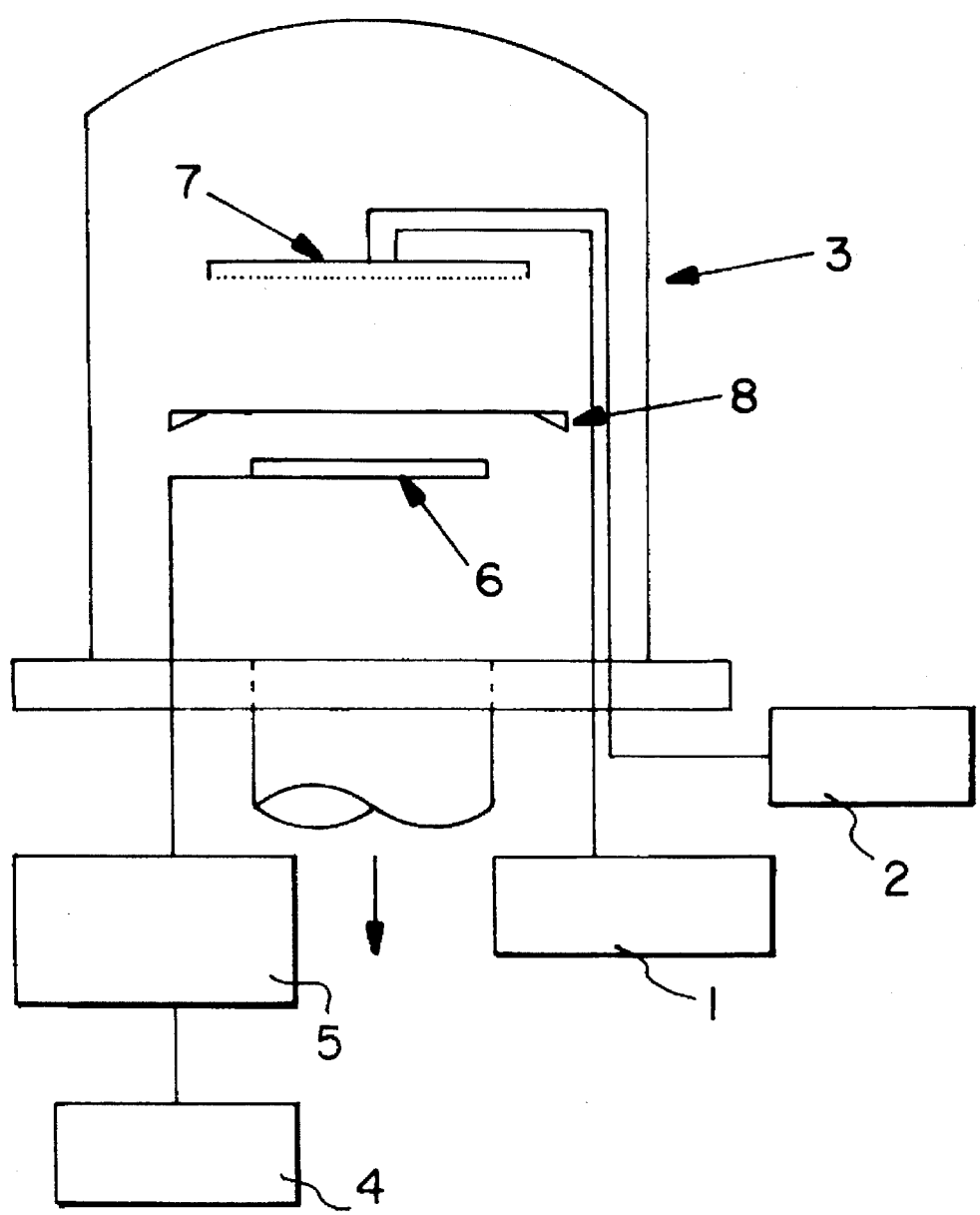
FIG. 1 is a schematic view illustrating a high frequency plasma CVD device which is used in the present invention.

FIG. 1 shows a high-frequency plasma CVD device used in the present invention, for forming an organosilicic compound coating film. This device comprises a stainless steel belljar type vacuum chamber 3 incorporating an inlet port 1 for introducing a monomer which is liquid at room temperature, in gaseous-form, and an oxygen inlet port 2, and having a diameter of 60 cm, a high frequency power source 4 (13.56 MHz, 1.5 KW, JEH-01B) manufactured by Japan Electronic Co., Ltd., a matching box 5, a disc-like high frequency electrode 6 having a diameter of 13 cm, a cylindrical ground electrode 7 having a diameter of 20 cm and a height of 1.5 cm, a sample holder 8 laid between both electrodes and the like. The device shown in FIG. 1 can form both organosilicic compound coating film as an intermediate layer and silicon oxide coating film as a gas-tight layer.

An oil-sealed rotary vacuum pump and an oil diffusion pump were used for a vacuum pump, and the pump was continuously operated for evacuation during pretreatment and formation of a film so as to carry out a pretreatment process and a film coating test.

Hexamethyl disiloxane (which will be denoted hereinbelow as HMDS) was used as the monomer which is liquid at room temperature, and oxygen gas was used as the reaction gas. These gases were introduced into the chamber through different routes, and were mixed within the ground electrode before they are discharged into the chamber.

The ground electrode and the high frequency electrode were laid in parallel (by a distance of 7 cm), and two kinds of plastic films were used as samples in each of the embodiments, PP film that is, 100 μm PET sheet or 50 μm PP film was laid between the high frequency electrode and the ground electrode by the insulative sample holder (at a distance of 5 cm from the high frequency electrode). A PET resin container having a shape shown in FIG. 3 was used as a bottle-shape sample. The sample holder (which is not shown) laid between the high frequency electrode and the ground electrode (the center axis of the bottle was set at a distance of 1.75 cm from the high frequency electrode) incorporates an autorotation mechanism and is insulative.

Figure 2:
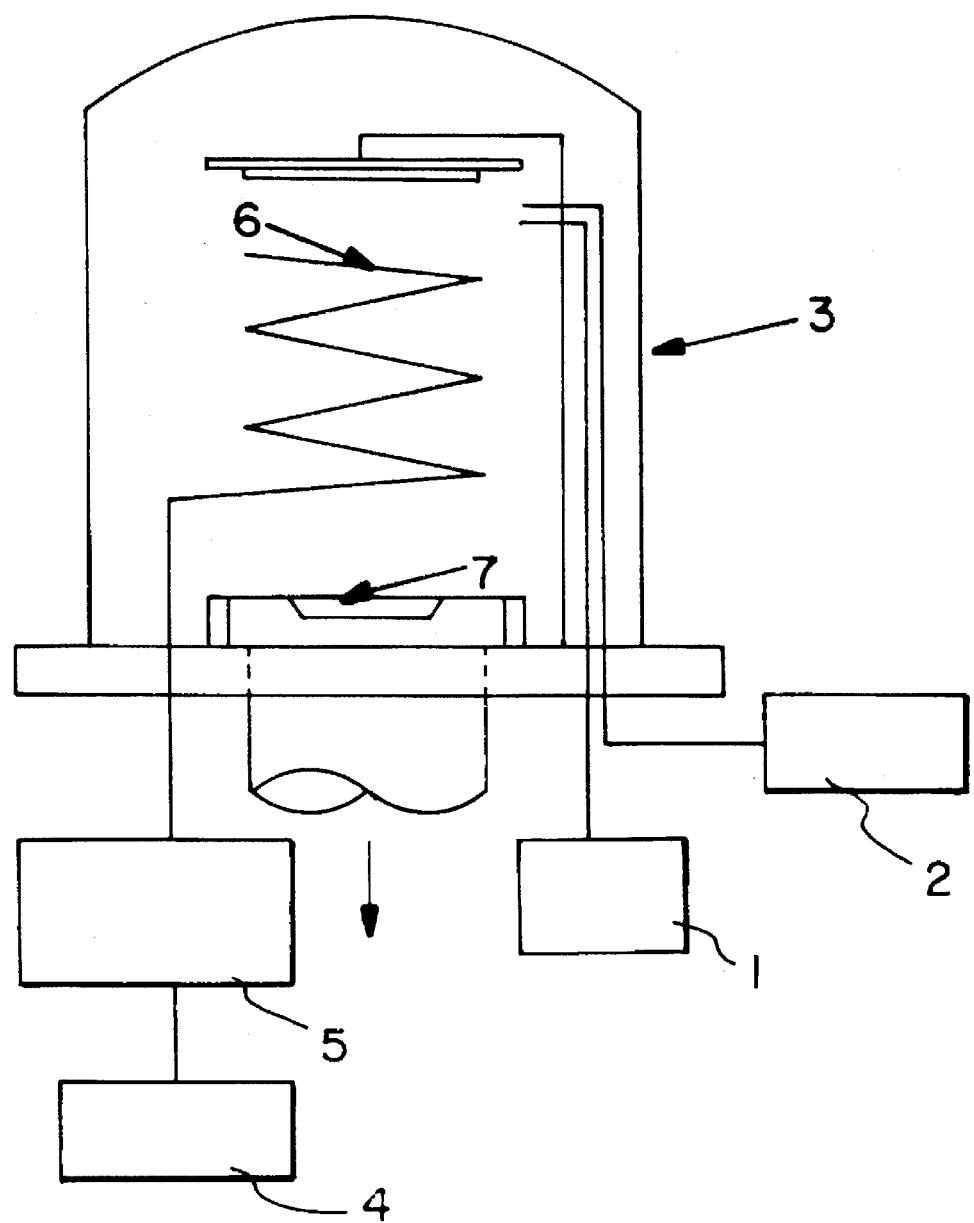
FIG. 2 is a schematic view illustrating a vacuum evaporation device for forming a silicon oxide coating film.

FIG. 2 shows a vacuum evaporation device for forming a silicon oxide film as a gas-tight layer used in the embodiments. This device comprises a stainless belljar type vacuum chamber 1 incorporating two system gas inlet ports 1 and 2, and having a diameter of 60 cm, a high frequency power source 4 (13.56 MHz, 1.5 KW, JEH-01B), a matching box 5, a coil high frequency electrode formed of a stainless round bar, a tungsten board 7, a sample holder and the like.

An oil-sealed rotary vacuum pump and an oil diffusion pump were used as a vacuum pump which were continuously operated for evacuation during formation of a film, and a thin film coating test was carried out.

TABLE 1

| | Ratio (%) in First Layer | | | Thickness of First Layer | Permeation of Steam (g/m² day, at |
|---|---|---|---|---|---|
| | Si | O | C | (μm) | 40° C. 90% RH) |
| Reference Example 1 | 16 | 36 | 48 | 0.053 | 0.3 |
| Reference Example 2 | 22 | 28 | 51 | 0.034 | 0.24 |
| Reference Example 3 | 24 | 55 | 21 | 0.042 | 0.4 |
| Comparison Example 1 | 0 | 20 | 80 | 0.030 | 1.8 |
| Comparison Example 2 | 10 | 29 | 61 | 0.041 | 1.6 |
| Comparison Example 3 | 27 | 63 | 10 | 0.046 | 1.5 |

Reference Example 1

Hexamethyl disilane, ethylene and oxygen gas were mixed, and a polymer coating film as a first layer composed of 16% of Si, 36% of O and 48% of C was formed on the surface of a biaxial oriented polyethylene terephathalate sheet having a thickness of 100 μm with the use of a low temperature plasma CVD method. The thickness of this coating film was 0.053 μm. A thin film as a second layer in which the composition ratio of silicon and oxygen is 1:1.8, having a thickness of 0.7 μm was formed over the coating film with the use of a high frequency ion plating method.

The composition of the polymer of the organosilicic compound which forms the first layer of the composite is measured by X-ray photoelectron spectroscopy, or ESCA. See generally, C. D. Wagner et al, "*Empirical Atomic Sensitivity Fractions for Quantitive Analysis*", Surface and Interface Analysis, Vol. 3, No. 5, Pages 211–225 (1981), and Akira Ishitani, "*Surface Analysis of High Polymer Material by ESCA*", Hyomen (Surface), Vol. 17, No. 1, Pages 26–38 (1979), both references being incorporated herein.

The X-ray Photoelectron Spectroscopy (XPS or ESCA) method used for measuring the layer composition is described by applicant as follows:

When mono-colored X-ray is exposed onto a sample placed in the high vacuum atmosphere, light electrons are emitted from the sample. Then energy division is made so as to observe the change in numbers of light electrons based on the motion energy in the form of the spectrum.

When an X-ray having hv energy gives rise to light electrons having kinetic energy K.E., bond energy B.E. of electrons is obtained in accordance with Energy Conservation Principle (hv=K.E.+B.E.). From this bond energy B.E., the elements on the surface of the sample are identified, and the amount of elements on the surface of the sample is obtained based on intensity (or number) of light energy having the bond energy.

For XPS determination, the ESCA System of PHI5100 made by Perkin-Elmer Co. was used. Further, Mg was used as an origin for generating the X-rays.

X-rays were exposed onto the surface of a sample, and an energy division was made by a wide scan (1100 eV), and the element analysis for the surface layer of the sample was made on the qualitative basis. Then, the intensity of each of the elements was measured by means of a narrow scan which scans around the bond energy corresponding to the inner core electrons of each of the elements. Finally, the element density ratio (element percentage) was obtained taking into consideration variations on sensitivity depending on the elements and on factors depending on measurement devices.

The method to adjust the element ratio of silicon, carbon, and oxygen in a first layer and a second layer is carried out by adjusting the ratio of gases used, namely, organosilicon (e.g. HMDSO), ethylene gas and oxygen gas. For examples, the film composed of 22% silicon, 28% oxygen and 51% carbon, which is shown as Reference Example 2 in Table 1 was formed by a plasma of HMDS gas; the film of 0% silicon, 20% oxygen and 80% carbon, which is shown as Comparison Example 1 in Table 1 was formed by a plasma containing a mixture of 90% ethylene gas and 10% oxygen gas. Further, the film composed of Comparison Example 3 of Table 1 can be formed by a plasma of a mixture of gas of 50% HMDS and 50% oxygen gas. In other words, to increase the content of silicon, a monomer gas having a high silicon gas content ratio such as tetramethyl siloxane was used. In contrast, to increase the content of oxygen, a plasma CVD method wherein the gas mixture contains more oxygen, or a plasma CVD method wherein the gas mixture contains a higher oxygen ratio is used.

As mentioned earlier, the XPS Method was used to analyze the surface of the first layer and second layer. The information obtained by the method is the element density (percent) of the surface of the sample. Table 1, Reference Example 1, the ratio of the first layer indicates 16% silicon, 36% oxygen and 48% carbon. These figures are expressed in element percent, respectively, based on the content ratio of silicon, oxygen and carbon detected from the sample by the XPS Method wherein the density is taken as 100%.

The composition ratio means the number of elements of silicon, oxygen or carbon based on their element percent derived from the XPS method. For Example, the first layer of Reference Example 1 in Table 1 of page 16 indicates that 16% silicon may be set as 1 (one), then 36% oxygen may be set as 2.25 and 48% carbon as 3. Then the composition ratio becomes: oxygen:carbon=1:2:3. Likewise the composition ratio of the first layer of reference Example 2 becomes silicon (22%): oxygen (28%):Carbon (51%)=2:3:5.

Reference Examples 2 to 3

The first and second layers were formed similar to the reference example 1, excepting that the composition ratio of silicon, oxygen and carbon in the first layer were changed as shown in Table 1.

COMPARISON EXAMPLES 1 TO 3

The first and second layers were formed similar to the reference example 1, excepting that the composition ratio of silicon, oxygen and carbon in the first layer is changed as shown in Table 1.

The composition ratios of the first layers in the first to third reference examples and the first to third comparison examples, and the composition ratios and the film thicknesses of the second layers are shown in Table 1 together with the vapor permeation volumes of sheets on which these coating films are formed.

TABLE 2

|  | Film | Permeation of Oxygen Gas (cc/m² day atm) |
| --- | --- | --- |
| Reference Example 4 | Film - 1 | 0.3 |
| Comparison Example 4 | Film - 2 | 1.4 |
| Comparison Example 5 | Uncoated Film | 57.6 |

Reference Example 4

A first layer in which the composition ratio of silicon, oxygen and carbon is 2:3:5, having a film thickness of 0.04 μm was formed by the plasma CVD method on the surface of a biaxial oriented polyethylene terephthalate film having a thickness of 25 μm, and a second layer in which the composition ratio of silicon, oxygen and carbon is 3:6:1, having a film thickness of 0.056 μm was formed by the plasma CVD method, over the first layer.

COMPARISON EXAMPLE 4

The same process as that of the reference example 4 was taken, excepting that no first layer was formed.

The oxygen gas permeation volumes of these films were shown in Table 2 together with that of a film in a comparison example 5 which was not treated with no coating.

TABLE 3

|  | Cup | Permeation of Oxygen Gas (cc/m² day, at 40° C. 90% RH) |
| --- | --- | --- |
| Reference Example 5 | Cup - 1 | 0.1 |
| Comparison Example 6 | Cup - 2 | 1.5 |
| Comparison Example 7 | Uncoated Cup | 1.8 |

Reference Example 5

A first layer in which composition ratio of silicon, oxygen and carbon is 2:3:5, having a film thickness of 0.047 μm, was formed by the plasma CVD method over the inner surface of an inverted-conical shape cup made of biaxial oriented polyethylene terephathalate and having a bore diameter of 60 mm, a bottom diameter of 20 mm and a height 60 mm, and a second layer in which the composition ratio of silicon, oxygen and carbon is 3:6:1, having a film thickness of 0.069 μm, was formed by the plasma CVD method over the first layer.

COMPARISON EXAMPLE 6

The same process as that of the reference example 5 was taken, excepting that no first layer was formed.

The vapor permeation volumes of these cups are shown in Table 3 together with that of a cup in a comparison example 7 which was not treated, having no coating.

It is found that the gas-tight plastic material according to the present invention has a very thin gas-tight layer and exhibits an excellent gas-tight effect which would greatly deteriorate if the composition ratio in each layer exceeds its specific range.

TABLE 4

|  |  | Permeation of Oxygen Gas | Permeation of Steam |
| --- | --- | --- | --- |
| Reference Example 6: | PET | 0.42 | 0.31 |
|  | PP |  | 0.33 |
| Reference Example 7: | PET | 0.38 | 0.33 |
|  | PP |  | 0.38 |
| Reference Example 8: | PET | 0.44 | 0.35 |
|  | PP |  | 0.32 |
| Comparison Example 8: | PET | 0.78 | 1.52 |
|  | PP |  | 1.51 |
| Comparison Example 9: | PET | 1.22 | 1.76 |
|  | PP |  | 1.22 |
| Comparison Example 10: | PET | 1.56 | 1.88 |
|  | PP |  | 1.43 |
| Comparison Example 11: | PET | 1.37 | 1.82 |
|  | PP |  | 1.35 |
| Comparison Example 12: | PET | 1.02 | 1.25 |
|  | PP |  | 1.12 |
| Untreated | PET | 14.22 | 5.28 |
| Untreated | PP |  | 3.51 |

Note:
In this table 4, the results of using PP for samples in the reference examples and comparison examples in addition to PET are also shown.

Reference Example 6

A PET sheet and a PP sheet were used as plastic materials to be treated. With the use of the device as shown in FIG. 1, the oil-sealed rotary vacuum pump and the oil diffusion pump were operated for evacuation so as to effect a vacuum of 2 to 3× $10^{-5}$ torr in the chamber, and then HMDS vapor was introduced into the chamber until the degree of vacuum in the chamber becomes 3×$10^{-3}$ torr. An input power of 300 W was introduced into the chamber from the high frequency power source by way of the match box so as to produce HMDS plasma, and the introduction volume of the HMDS vapor was adjusted so as to set the degree of vacuum in the chamber to 1×$10^{-3}$ torr which was held for 5 minutes. Thus, an HMDS polymer coating film was formed.

After 5 minutes elapses, the introduction of the HMDS vapor and the introduction of the high frequency power were stopped, then oxygen gas was introduced into the chamber until the degree of vacuum in the chamber becomes 1×$10^{-3}$ torr, and further, HMDS vapor was introduced into the chamber until the degree of vacuum in the chamber becomes 2×$10^{-3}$.

An input power of 300 W was introduced into the chamber from the high frequency power source by way of the match box so as to effect HMDS plasma and oxygen plasma which were held for 10 minutes, and accordingly, an silicon oxide coating film was formed over the HMDS polymer coating film formed over the sample (100μ BOPET sheet). Then a thin film was formed thereover.

The thickness of the intermediate layer was 0.036 μm, and the composition ratio was Si:O:C=2:3:5.

The thickness of the gas-tight layer was 0.062 μm, and the composition ratio was Si:O:C=3:6:1.

Reference Example 7

A PET sheet and a PP sheet were used as the plastic materials to be treated.

The oil-sealed rotary vacuum pump and the oil diffusion pump were operated so as to set the degree of vacuum in the chamber to 2 to 3×$10^{-5}$ torr, and then HMDS vapor was introduced into the chamber until the degree of vacuum in the chamber becomes 3×$10^{-3}$ torr. An input voltage of 300

W is introduced into the chamber from the high frequency power source by way of the match box so as to produce HMDS plasma, and then the introduction volume of HMDS vapor was adjusted so as to set the degree of vacuum in the chamber to $1\times10^{-3}$ torr which was held for 5 minutes. Thus, an HMDS polymer coating film was formed.

After 5 minutes elapses, the introduction of the HMDS vapor into the chamber and the introduction of the input power were stopped, and the pressure in the chamber was set to the normal pressure by introducing the atmospheric air. Then, the sample was taken out, and was then set at a position which was opposed to the vapor source in the vacuum evaporation device as shown in FIG. 2 at a distance of 20 cm from the vapor source.

The oil-sealed rotary vacuum pump and the oil diffusion pump were operated so as to set the degree of vacuum in the chamber to 2 to $3\times10^{-5}$ torr, and then oxygen gas was introduced into the chamber so as to set the degree of vacuum in the chamber to $3\times10^{-4}$ torr. Then a voltage was applied to both ends of the tungsten board in order to heat the board due to an electric resistance so as to evaporate a mixture of silicon monoxide and silicon dioxide contained in the board. Thus, an $SiO_x$ film was formed under vacuum evaporation over the HMDS polymer coating film formed on the surface of the sample.

The thickness of the intermediate layer was 0.04 μm, and the composition ratio was Si:O:C=2:3:5.

The thickness of the gas tight layer was 0.095 μm, and the composition ratio thereof was Si:O:C=1:1.8:0.

Reference Example 8

PET and PP sheets were used as plastic materials to be treated.

The oil-sealed rotary vacuum pump and the oil diffusion pump shown in FIG. 1, were operated so as to set the degree of vacuum in the chamber to 2 to $3\times10^{-5}$ torr, and HMDS vapor was introduced into the chamber until the degree of vacuum in the chamber becomes $3\times10^{-3}$ torr. An input power of 300 W was introduced into the chamber from the high-frequency power source by way of the matching box so as to produce HMDS plasma, and the introduction volume of the HMDS vapor was adjusted so as to hold the degree of vacuum in the chamber to 1 9 $10^{-3}$ torr which was held for 5 minutes. Thus, an HMDS polymer coating film was formed.

After 5 minutes elapses, the introduction of the HMDS vapor and the introduction of the high frequency power were stopped, and the pressure of the inside of the chamber was set to the normal pressure by introduction of the atmospheric air therein. Then, the sample was taken out, and was set in the vacuum evaporation device shown in FIG. 2 at a position opposing the vapor source at a distance of 20 cm from the latter.

The oil-sealed rotary vacuum pump and the oil diffusion pump were operated so as to set the degree of vacuum in the chamber to 2 to $3\times10^{-5}$ torr, and then oxygen gas was introduced therein so as to set the degree of vacuum in the chamber to $3\times10^{-4}$ torr. Then an inlet power of 200 W was introduced into the chamber from the high frequency power source by way of the matching box so as to produce oxygen plasma, and a voltage is applied to both ends of a tungsten board so as to effect electrical resistance heat in order to evaporate a mixture of silicon monoxide and silicon dioxide contained in the board. Accordingly, an $SiO_x$ film is formed over the HMDS coating film on the surface of tie sample by a high frequency ion plating method.

The intermediate layer had a thickness of 0.38 μm and an composition ratio which was Si:O:C=2:3:5.

The gas tight layer had a thickness of 0.084 μm and the composition ratio which was Si:O:C=1:1.8:0.

COMPARISON EXAMPLE 8

PET and PP sheets were used as plastic materials to be treated.

With the use of the device shown in FIG. 1, the oil-sealed rotary vacuum pump and the oil diffusion pump were operated to set the degree of vacuum in the chamber to 2 to $3\times10^{-5}$ torr, and oxygen gas was introduced into the chamber until the degree of vacuum in the chamber becomes $1\times10^{-3}$ torr, and then HMDS vapor was introduced into the chamber until the degree of vacuum in the chamber becomes $2\times10^{-3}$ torr.

An input power of 300 W was introduced into the chamber from the high frequency power source by way of the matching box so that HMDS plasma and oxygen plasma were generated which are held for 10 minutes, and an HMDS polymer coating film was formed over the sample (100μ BOPET sheet).

The gas tight layer had a thickness of 0.14 μm, and the composition ratio which was Si:O:C=3:6:1.

COMPARISON EXAMPLE 9

PET and PP sheets were used as plastic materials to be treated.

With the use of the device shown in FIG. 1, the oil-sealed rotary vacuum pump and the oil diffusion pump were operated to set the degree of vacuum in the chamber to 2 to $3\times10^{-5}$ torr, and ethylene gas was introduced into the chamber until the degree of vacuum in the chamber becomes $3\times10^{-3}$ torr. An input power of 300 W was introduced into the chamber from the high frequency power source by way of the matching box so as to generate ethylene gas plasma. The introduction volume of the ethylene gas was adjusted so as to set the degree of vacuum in the chamber to $1\times10^{-3}$ torr which was held for 5 minutes. Thus, an ethylene polymer coating film was formed.

After 5 minutes elapses, the introduction of the ethylene gas into the chamber and the introduction of the high frequency power were stopped. Oxygen gas was introduced into the chamber until the degree of vacuum in the chamber becomes $1\times10^{-3}$ torr, and further, HMDS vapor was introduced into the chamber until the degree of vacuum in the chamber becomes $2\times10^{-3}$ torr.

An input power of 300 W was introduced into the chamber from the high frequency power source by way of the matching box so as to effect HMDS plasma and oxygen plasma which were held for 10 minutes so as to form a thin coating film over the sample (100μ BOPET sheet).

The intermediate layer had a thickness of 0.047 μm and the composition ratio which was Si:O:C=0:1:4.

The gas tight layer had a thickness of 0.069 μm, and the composition ratio which was Si:O:C=3:6:1.

COMPARISON EXAMPLE 10

PET and PP sheet were used as plastic materials to be treated.

A sample (untreated 100μ PET sheet) was set in the vacuum evaporation device shown in FIG. 2 at a position opposing the vapor source at a distance of 20 cm from the latter.

The oil-sealed rotary vacuum pump and the oil diffusion pump were operated so as to set the degree of vacuum in the chamber to 2 to $3\times10^{-5}$ torr, and oxygen gas was introduced to set the degree of vacuum to $3\times10^{-4}$ torr. A voltage was applied to both ends of a tungsten board in order to effect electrical resistance heating so as to evaporate a mixture of silicon monoxide and silicon dioxide contained in the board, and accordingly, an $SiO_x$ coating film was formed over the sample.

The gas tight layer has a thickness of 0.14 μm, and the composition ratio which was Si:O:C=1:1.8:0.

COMPARISON EXAMPLE 11

PET and PP sheets were used as plastic materials.

With the use of the device shown in FIG. 1, the oil-sealed rotary vacuum pump and the oil diffusion pump were operated to set the degree of vacuum in the chamber to 2 to $3\times10^{-5}$ torr, and ethylene gas was introduced until the degree of vacuum in the chamber becomes $3\times10^{-3}$ torr. An input power of 300 W was introduced into the chamber from the high frequency power source by way of the matching box so as to effect ethylene gas plasma, and the introduction volume of the ethylene gas was adjusted so as to hold the degree of vacuum in the chamber at $1\times10-3$ torr which was held for 5 minutes. After 5 minutes elapses, the introduction of the ethylene gas and the introduction of the high frequency power were stopped, and the pressure in the chamber was set to the normal pressure by introducing the atmospheric air thereinto. The sample was taken out, and was set in another vacuum evaporation device (device 2) at a position opposing the vapor source at a distance from the latter.

The oil-seated rotary vacuum pump and the oil diffusion pump were operated so as to set the degree of vacuum in the chamber to 2 to $3\times10-5$ torr, and oxygen gas was introduced to set the degree of vacuum to $3\times10-4$ torr. A voltage was applied to both ends of a tungsten board in order to effect electrical resistance heating so as to evaporate a mixture of silicon monoxide and silicon dioxide contained in the board, and accordingly, an $SiO_x$ coating film was formed over the treated surface of the sample by the vacuum evaporation method.

The intermediate layer had a thickness of 0.041 μm and the composition ratio which was Si:O:C=0:1:4.

The gas tight layer has a thickness of 0.13 μm, and the composition ratio which was Si:O:C=1:1.8:0.

COMPARISON EXAMPLE 12

PET and PP sheets were used as plastic materials.

With the used of the device shown FIG. 1, the sample was set in the vacuum evaporation device (device 2) at a position opposing the vapor source at a distance from the latter.

The oil-sealed rotary vacuum pump and the oil diffusion pump were operated so as to set the degree of vacuum in the chamber to 2 to $3\times10^{-5}$ torr, and oxygen gas was introduced to set the degree of vacuum to $3\times10^{-4}$ torr. An input voltage of 200 W was introduced into the chamber from the high frequency power source by way of the matching box so as to effect oxygen gas plasma. A voltage was applied to both ends of a tungsten board in order to effect electrical resistance heating so as to evaporate a mixture of silicon monoxide and silicon dioxide contained in the board, and an $SiO_x$ coating film was formed over the treated surface of the sample by a high frequency ion plating method.

The gas tight layer has a thickness of 0.09 μm, and the composition ratio which was Si:O:C=1:1.8:0.

Measuring Devices:

Oxygen Gas Permeation: OX-Tran 100 manufactured by Modern Control Co.

Measuring Condition: 27° C. (Permeation Unit: cc/m² day atm)

Steam Permeation: Automatic Permeability Tester L-80-4000 manufactured by Lyss Co.

Measuring Condition: 90% RH at 40° C. (Permeation Unit: g/m² day).

The results of gas permeability performance tests of the sheets obtained in the reference examples 6 to 8 and the comparison examples 8 to 12 are shown in Table 4.

Test Methods:

Steam Permeation Measurement:

2 g of water was charged in a bottle, and then the bottle was heat-seated with an aluminum foil/PET lamination with the PET surface thereof being opposed to the bottle. Then the bottle was placed in an atmosphere of 40% RH at 50° C. A variation in weight was measured. The area of permeation of the used bottle was 50 cm².

TABLE 5

|  | Bottle | Permeation of Steam (cc/m² day, at 50° C. 80% RH) |
| --- | --- | --- |
| Reference Example 9 | Bottle - 1 | 0.3 |
| Comparison Example 13 | Bottle - 2 | 2.5 |
| Comparison Example 14 | Uncoated Bottle | 3.8 |

Reference Example 9

Figure 3:
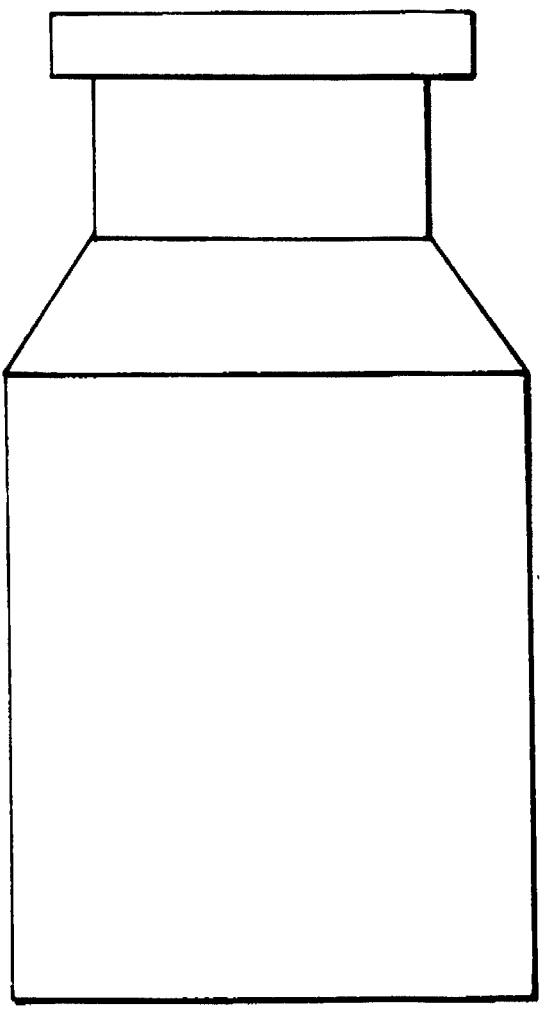
FIG. 3 is a schematic side view illustrating a bottle used in the present invention.

A sample of a bottle shape shown in FIG. 3 was used, instead of the plastic material in the reference example 6. The same process as that of the reference example 6 was carried out with this sample, excepting that the speed of autorotation of the bottle sample was 10 r.p.m. during formation of a coating film. The bottle had a bore diameter of 20 mm and the bottom diameter 25 mm, and the height of the port thereof was 47.5 mm while the height of the shoulder part thereof was 30 mm.

The intermediate layer had a thickness of 0.044 μm and the composition ratio which was Si:O:C=2:3:5.

The gas-tight layer had a thickness of 0.069 μm and the composition ratio which was Si:O:C=3:6:1.

COMPARISON EXAMPLE 13

The same process as that of the reference example 9 was carried out, excepting that no first layer was formed.

The steam permeation volumes of these bottles are shown in Table 5 together with a bottle in the comparison example which was not treated with any coating.

According to the present invention, the permeation of gas can be effectively blocked with a thin film in the order of 1/100 μm, and the recycle ability after use is satisfactory.

Further, according to the present invention, a very thin silicon oxide film can be easily formed over, stabilized and fixed to the surface of the plastic material. This film can prevent permeation of gas therethrough, and is very thin so that no problems arises in the recycle and disposal thereof.

What is claimed is:

1. A gas-tight laminated plastic film material comprising:
    a plastic film;
    a first layer formed over said plastic film and made of polymer of organosilicic compound containing more than 15% silicon element, more than 20% carbon element and the balance oxygen element, based on 100% of the silicon, carbon and oxygen elements; and a second layer formed over said first layer and made of more than 60% silicon oxide expressed as $SiO_x$ wherein x is 1.5 to 2.0.

2. A gas tight laminated plastic film material as set forth in claim 1, wherein said second layer consists of a silicon oxide compound, and its composition is $SiO_x$, wherein x=1.5 to 2.0.

3. A gas-tight laminated plastic film material as set forth in claim 1, wherein said first layer has a film thickness of 0.01 to 0.1 µm, and said second layer has a film thickness of 0.03 to 0.2 µm.

4. A gas-tight laminated plastic sheet material comprising:

a plastic substrate formed of polypropylene, polyethylene or polyethylene terephthalate;

a first layer formed over said plastic sheet and made of polymer of organosilicic compound containing more than 15% silicon element, more than 20% carbon element and the balance oxygen element, based on 100% of the silicon, carbon and oxygen elements;

and a second layer formed over said first layer and made of more than 60% silicon oxide expressed was $SiO_x$ wherein x is 1.5 to 2.0.

* * * * *